United States Patent [19]

Christoph et al.

[11] Patent Number: 4,606,493
[45] Date of Patent: Aug. 19, 1986

[54] METHOD AND APPARATUS FOR SOLDERING PLATE-SHAPED CIRCUIT CARRIERS INSIDE AN INERT GAS SOLDERING MEANS

[75] Inventors: Heinz Christoph, Erkental; Jürgen Gamalski, Berlin; Eduard Lenz, Berlin; Ulrich Neumann, Berlin; Reinhard von der Schmidt, Berlin, all of Fed. Rep. of Germany

[73] Assignee: Siemens Aktiengesellschaft, Berlin & Munich, Fed. Rep. of Germany

[21] Appl. No.: 589,549

[22] Filed: Mar. 14, 1984

[30] Foreign Application Priority Data

Mar. 15, 1983 [DE] Fed. Rep. of Germany ....... 3309648

[51] Int. Cl.⁴ ............................................. B23K 31/02
[52] U.S. Cl. ................................. 228/180.1; 228/219;
228/232; 228/238; 228/240; 228/37
[58] Field of Search ............... 228/232, 220, 219, 240, 228/238, 180.1, 37

[56] References Cited

U.S. PATENT DOCUMENTS 3,136,032  6/1964  Berndsen ............................. 228/220
3,386,166  6/1968  Tardoskegyi ........................ 228/232
3,515,330  6/1970  Bronson et al. ..................... 228/37
3,882,596  5/1975  Kendziora et al. ................. 228/232

OTHER PUBLICATIONS

IBM Technical Disclosure Bulletin, vol. 11, No. 12, May 1969.

Primary Examiner—Nicholas P. Godici
Assistant Examiner—Samuel M. Heinrich
Attorney, Agent, or Firm—Hill, Van Santen, Steadman & Simpson

[57] ABSTRACT

The invention concerns preventing oxidation of printed circuit board metal surfaces as a result of heat produced in a solder bath arrangement and reducing thermal stress defects from occurring in the circuit carrier being soldered. An enclosed reaction chamber is provided with the solder bath and supplied with a pressurized atmosphere of inert gas which gas seals the reaction chamber from ambient air. The inert gas is discharged from jets against the solder side (the connector post side) of the printed circuit boards at a point upstream of the solder bath and the inert gas is at a temperature substantially higher than the solder bath temperature.

7 Claims, 1 Drawing Figure

U.S. Patent
Aug. 19, 1986
4,606,493
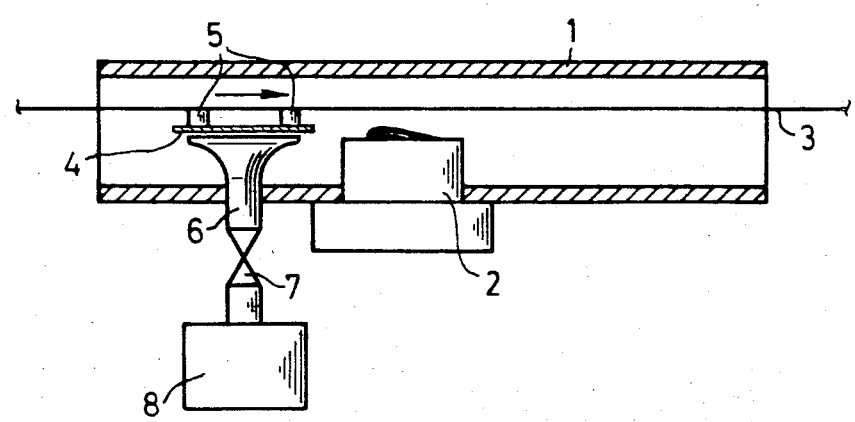

METHOD AND APPARATUS FOR SOLDERING PLATE-SHAPED CIRCUIT CARRIERS INSIDE AN INERT GAS SOLDERING MEANS

BACKGROUND OF THE INVENTION

The invention relates to soldering of plate-shaped circuit carriers inside an inert gas wave soldering means wherein the reaction chamber is gas-sealed from the environment and contains at least one wave solder bath and at least one jet for the introduction of heated inert gas.

Flux-free or inert gas soldering is a known technique in the construction of thick film circuits and has proven advantageous over conventional soldering with flux in an air atmosphere. A number of soldering defects, such as, for example, solder bridges, solder pegs and bubbles, which are exclusively or at least in part due to the influence of the flux employed can be avoided by such soldering in inert gas.

A flow bath solder means encapsulated on all sides to form a reaction chamber is gas-sealed from the ambient environment in the known inert gas soldering operation. By means of supplying an oxygen-free inert gas, a forming gas such as nitrogen, an atmosphere is produced in the reaction chamber, in which the soldering process can be executed without the influence of a fluxing agent. It is necessary or at least expedient to heat the circuit carrier before or during its transport to the solder flow bath. Typically, the solder flow bath is disposed in the central region of an encapsulated or chamber channel that has a suitable planar cross-section matched to the dimensions of the circuit carriers to be soldered. Heating elements to heat the circuit carriers are disposed in the channel in the area in front of the solder flow bath. The inert gas is blown into the channel through a plurality of jets preceding as well as following the solder flow bath. The inert gas creates a slight overpressure inside the channel such that it flows out in turn at the channel entrance and exit, whereby penetration of ambient air into the inside of the channel is prevented.

Attempts to apply the known inert gas soldering method to soldering conventional printed circuit boards, wherein the connector posts are disposed on one face and the circuit components are disposed on the other opposed face of the printed circuit board have heretofore been unsuccessful. The present invention, however, concerns a way that inert gas soldering can also be employed for conventional printed circuit boards.

SUMMARY OF THE INVENTION

For soldering circuit carrier boards in an inert gas soldering arrangement, there is provided a reaction chamber containing a solder bath, such as a wave soldering bath, and at least one inert gas jet which is disposed in front of the bath. The circuit carriers are conducted through the reaction chamber such that the inert gas flows against the solder side of the circuit carrier and then the circuit carrier is conducted to the solder bath. The flow of inert gas from the jet means is of a pressure such that it serves to gas seal the reaction chamber from ambient at the entry and exit open ends of the chamber. The inert gas is preheated to a temperature slightly higher than a desired temperature for the solder side of the circuit carrier upon its arrival at the solder bath. The jet means are disposed such that only the solder side of the circuit carrier receives a flow of preheated inert gas thereagainst.

A critical advantage of the invention is that relatively high temperatures can be achieved on the solder side of the circuit carrier and a pronounced reducing effect of the inert gas can be achieved in this region without thereby exposing the components disposed on the other side of the circuit carrier to an elevated or even inadmissible temperature load. One can therewith reduce the preheating of the circuit carriers in the entrance region of the reaction chamber or, respectively, can even entirely forego such preheating and the inert gas can be used as the only heat source.

The apparatus for the implementation of the inventive method serves to achieve specific temperature distributions on the solder side of the circuit carriers. For example, the disposition of the jets is selected such than an approximately uniform temperature distribution occurs on the solder side of the circuit carriers. This can be promoted in that the jets comprise slit-shaped discharge openings. The temperature distribution on the solder side of the circuit carriers may be optimized in that the jets are connected to a common gas supply, but individually controlled via adjustable valves. Given an unthrottled connection of all jets to the gas supply, the entire solder side of a circuit carrier having maximum dimensions can be brought to an approximately uniform temperature. By means of appropriate adjustment, which may be made by means of a programmable control means, it is also possible to heat specific regions of the printed circuit board in which no solder location occur or, respectively, at whose back side particularly sensitive components require somewhat lower temperatures.

BRIEF DESCRIPTION OF THE DRAWING

The sole FIGURE is a schematic, partly cross-sectional side view of an inert gas soldering arrangement for circuit boards employing the invention.

DETAILED DESCRIPTION OF THE PREFERRED EMBODIMENT

An inert gas soldering arrangement for soldering, such as wave soldering, printed circuit boards in accordance with the invention has an enclosed reaction chamber 1 open at opposed ends defining a longitudinally directed transport channel therethrough.

A suitable solder bath 2 is situated inside the chamber 1 along its channel. Printed circuit boards 4 are conducted to the solder bath 2 by a conveyor line means 3. Before the printed circuit boards 4, which are attached to the conveyor line 3 by means of suitable latch elements 5, reach the solder bath 2, they pass over a plurality of slit-shaped jets 6 disposed laterally next to one another and opening upward perpendicular to the conveying direction. The jets 6 are each individually controllably connected via an adjustment valve 7 to a pressurized gas supply source 8 which contains an inert or reducing gas, such as nitrogen.

The gas supply 8 may contain heating elements or otherwise is supplied with heated gas, so that the inert gas flowing upward against the circuit boards is a heated, high temperature flow.

The temperature of the gas is selected such that the solder side of the printed circuit boards 4 facing the jets 6 is heated to a temperature that is calculated noticeably higher than the solder bath temperature. In this manner, the solder side (or lower surface as shown in the figure having the connector posts) of each circuit board 4 is heated by the flow of heated gas thereagainst prior to contact with the solder bath for the purpose of preventing oxidation in the bath.

Heating elements at the entrance to the chamber 1 of the type typically used for heating objects in inert gas soldering devices can now be reduced or even eliminated due to the controlled heating provided by the flow of inert gas. The temperature of the inert gas is determined on the basis of various parameters. The presence or non-presence of a heating element in the reaction chamber is one of the parameters for setting the temperature of the inert gas. Further parameters are the quantity of supplied inert gas and the dwell time of the circuit carriers in front of the jets. In this context, an advantageous further development of the invention is that the preheating or the feed of the inert gas or the dwell time of the circuit carriers in front of the jets is controlled such that the inert gas impinges the solder side for a brief time with a temperature more than double the desired temperature. The short-duration influencing of the solder side with an inert gas of a correspondingly higher temperature is preferred to a method where there is a long dwell time of the solder side and a correspondingly lower temperature for the inert gas. Lower thermal stress effects on the back side of the circuit carrier (ie., on the circuit components disposed thereon) are thereby achieved. The temperature of the inert gas is set, for example, to more than 600° C., since the solder temperature is typically about 300° C. Given these temperatures, a nearly complete reduction of oxides at the solder side of the printed circuit boards occurs within a time span of seconds.

Ambient air is prevented from entering the chamber 1 at the entrance and exit openings for the conveyor means 3. The quantity of inert gas introduced via the valves 7 into the chamber 1 must be dimensioned such that a constant, slight overpressure prevails inside the chamber channel relative to the surrounding atmosphere, so that penetration of ambient air into the reaction chamber channel is prevented.

Although various minor modifications may be suggested by those versed in the art, it should be understood that we wish to embody within the scope of the patent warranted hereon all such modifications as reasonably and properly come within the scope of our contribution to the art.

We claim as our invention:

1. A method for inert gas soldering printed circuit boards in an enclosed reaction chamber sealed from ambient, said reaction chamber defining a longitudinal channel having opposed inlet and exit open ends, means for transporting circuit boards longitudinally from the inlet end to the outlet end from through said chamber channel, a solder bath means in said channel, and flow means for feeding inert gas under pressure into said channel, said method comprising:

disposing said flow means in the form of at least one jet having an opening facing upwardly and perpendicular to the transport path of said circuit boards at a place in front of said solder bath, transporting said circuit boards over said at least one jet such that inert gas flow is directed only against the solder sides of said circuit boards, and heating said inert gas in said flow means to a temperature higher than a desired temperature for the solder side of the circuit board upon its arrival at the solder bath means.

2. The method of claim 1, further comprising:
conducting said circuit boards over said at least one jet opening such that inert gas only briefly impinges on the solder sides of said circuit boards and heating said inert gas in said flow means to a temperature more than double the solder bath temperature.

3. The method of claim 1, further comprising:
providing a lateral row of a plurality of individual said jets to form said flow means and
individually controlling the flow of inert gas from each said jet.

4. Apparatus for inert gas soldering printed circuit boards in an enclosed reaction chamber sealed from ambient, said reaction chamber defining a longitudinal channel having opposed inlet and exit open ends, a solder bath means in said channel, a flow means for feeding inert gas under pressure into said channel, and means for transporting circuit boards longitudinally from the inlet end to the outlet end through said channel, the improvement comprising wherein said flow means comprises at least one jet having an opening facing upward and perpendicular to the transport path of said circuit boards at a place in front of said solder bath along the transport path, said means for transporting passing said circuit boards over said at least one jet opening such that inert gas flow is directed only against the solder sides of said circuit boards, and means for heating said inert gas in said flow means to a temperature higher than a desired temperature for the solder side of the circuit board upon its arrival at the solder bath means.

5. The apparatus of claim 4, wherein said flow means comprises a lateral row of a plurality of individual said jets and the openings of said jets permit a plurality of flows of said inert gas to impinge against the solder side of each circuit board.

6. The apparatus of claim 5, wherein the flow of inert gas from each said jet is individually controllable by means of respective control valve means associated with each said jet.

7. The apparatus of claim 4, wherein said means for transporting conducts said circuit boards over said at least one jet opening such that inert gas only briefly impinges on the solder sides of said circuit boards and said heating means heats said inert gas to a temperature more than double the solder bath temperature.

* * * * *